United States Patent [19]
Park et al.

[11] Patent Number: 5,736,443
[45] Date of Patent: Apr. 7, 1998

[54] FLASH EEPROM CELL AND METHOD OF MANUFACTURING THE SAME

[75] Inventors: Sung Bin Park; Shin Kuk Lee, both of Seoul; Suk Tae Hyun, Kyungki-Do, all of Rep. of Korea

[73] Assignee: Hyundai Electronics Industries Co., Ltd., Kyungki-Do, Rep. of Korea

[21] Appl. No.: 815,483

[22] Filed: Mar. 11, 1997

[30] Foreign Application Priority Data

Mar. 11, 1996 [KR] Rep. of Korea ............. 96-6340

[51] Int. Cl.$^6$ ................................. H01L 21/336
[52] U.S. Cl. ................ 438/257; 438/264; 438/266
[58] Field of Search ........................ 438/257, 259, 438/262, 264, 265, 266; 257/320

[56] References Cited

U.S. PATENT DOCUMENTS

| | | | |
|---|---|---|---|
| 4,380,863 | 4/1983 | Rao | 438/266 |
| 4,405,995 | 9/1983 | Shirai et al. | 257/320 |
| 5,284,784 | 2/1994 | Manley . | |
| 5,382,540 | 1/1995 | Sharma et al. | 436/264 |
| 5,412,238 | 5/1995 | Chang . | |
| 5,460,988 | 10/1995 | Hong | 438/259 |
| 5,476,801 | 12/1995 | Keshtbod | 438/264 |
| 5,494,838 | 2/1996 | Chang et al. | 438/264 |
| 5,556,799 | 9/1996 | Hing | 438/264 |
| 5,597,751 | 1/1997 | Wang | 438/264 |
| 5,643,814 | 7/1997 | Chung | 257/320 |

Primary Examiner—John Niebling
Assistant Examiner—Michael S. Lebertritt
Attorney, Agent, or Firm—Fish & Richardson P.C.

[57] ABSTRACT

This invention discloses a flash EEPROM cell and method of manufacturing the same, in which the flash EEPROM cell has two control gates which are symmetrical about a floating gate.

4 Claims, 2 Drawing Sheets

FLASH EEPROM CELL AND METHOD OF MANUFACTURING THE SAME

BACKGROUND OF THE INVENTION

1. Field of the Invention

This invention relates to a flash EEPROM cell and method of manufacturing the same, and more particularly to a flash EEPROM cell having two control gates which are symmetrical about a floating gate.

2. Description of the Prior Arts

A non-volatile memory device such as PROM, EPROM, EEPROM and flash EEPROM maintains information stored thereon without supplying a power. The flash EEPROM having merits of EPROM and EEPROM can electrically program information or electrically erase information stored thereon. The structure and electrical operation of the flash EEPROM will be explained with reference to FIG. 1.

As shown in FIG. 1, a conventional flash EEPROM includes a tunnel oxide layer 2, a floating gate 3, a dielectric layer 4 and a control gate 7 which are sequentially formed on a selected portion of a silicon substrate 1, and source and drain regions 5 and 6 which are formed in the silicon substrate 1 by implanting an impurity ion. Program, erasure and read out operation of the conventional flash EEPROM will be explained as follows:

A. Program operation

In order to charge electron to the floating gate 3, a high voltage of 12 through 13 volt is applied to the control gate 7, a voltage of 5 through 7 volt is applied to the drain region 6 and a source region 5 is ground. A channel is formed in the silicon substrate 1 under the floating gate 3 by the high voltage applied to the control gate 7. A high electric field is formed in the silicon substrate 1 adjacent to the drain region 6 due to the voltage applied to the drain region 6. Hot electron is occurred since current passes through the high electric field, wherein a few of the hot electron are injected to the floating gate 3 by electric field which is vertically formed by the high voltage applied to the control gate 7. As a result, threshold voltage $V_T$ of the memory cell is raised by injection of the hot electron.

B. Erasure operation

In order to discharge the electron stored on the floating gate 3, voltage of −10 through −11 volt is applied to the control gate 7, voltage of 5 volt is applied to the source region 5 and the drain region 6 maintains floating state. Accordingly, the electron injected to the floating gate 3 moves to the source region 5 by tunneling phenomenon, thereby lowering the threshold voltage $V_T$ of the memory cell.

C. Read out operation

When word line selection bias voltage, the voltage of 1 to 2 volt and ground voltage are applied to the control gate 7, the drain region 6 and the source region 5, respectively, information stored on the floating gate 3 is read out since the memory cell is turned on or turned off depend on the threshold voltage $V_T$ thereof.

SUMMARY OF THE INVENTION

It is an object of the present invention to provide a flash EEPROM cell and method of manufacturing the same which can improve operational efficiency of the flash EEPROM cell by forming two control gates which are symmetrical about a floating gate.

To accomplish the above objects, a flash EEPROM cell according to the present invention comprises a floating gate electrically insulated from a silicon substrate by a tunnel oxide layer; a dielectric layer formed on an entire structure including the floating gate; first and second control gates formed on the dielectric layer, wherein the first and second control gates are isolated from each other and surrounds a portion of the floating gate, respectively; source and drain regions formed in the silicon substrate under the portions of said floating gate. The first and second control gates are symmetrical about the floating gate.

Method of manufacturing a flash EEPROM cell according to the present invention, comprises the steps of sequentially forming a tunnel oxide layer and a floating gate on a selected portion of a silicon substrate: forming source and drain regions in the silicon substrate under the portions of the floating gate; forming a dielectric layer on the resulting structure after forming the source and drain regions; forming first and second control gates formed on the dielectric layer so that the first and second control gates are isolated from each other and surrounds a portion of the floating gate, respectively.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF THE INVENTION

Figure 1:
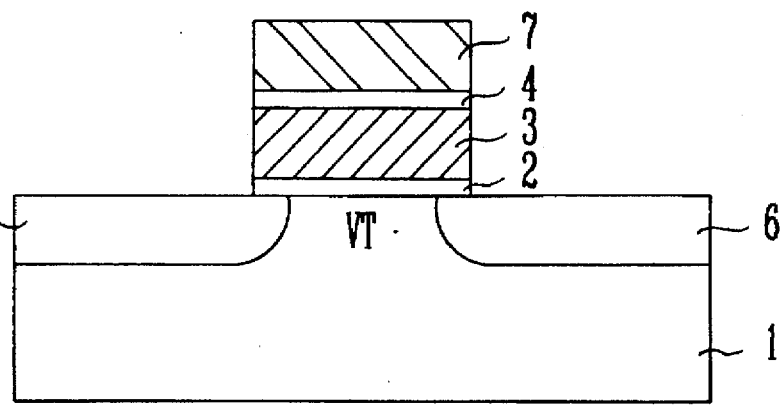
FIG. 1 is a cross sectional view for explaining a conventional flash EEPROM cell.
Figure 2A:
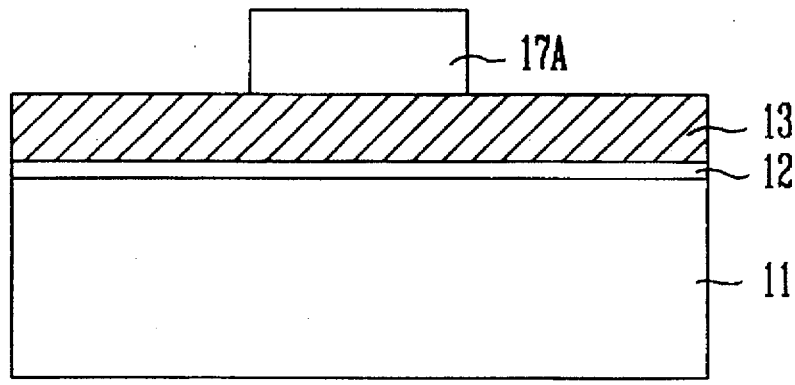
FIG. 2A through FIG. 2E are cross sectional views for explaining a flash EEPROM cell according to the present invention.

FIG. 2A through FIG. 2E are cross sectional views for explaining a flash EEPROM cell according to the present invention. FIG. 2A illustrates the formation in which a tunnel oxide layer 12 and a first polysilicon layer 13 are sequentially formed on a silicon substrate 11 and a first photoresist pattern 17A is then formed on the first polysilicon layer 13.

Figure 2B:
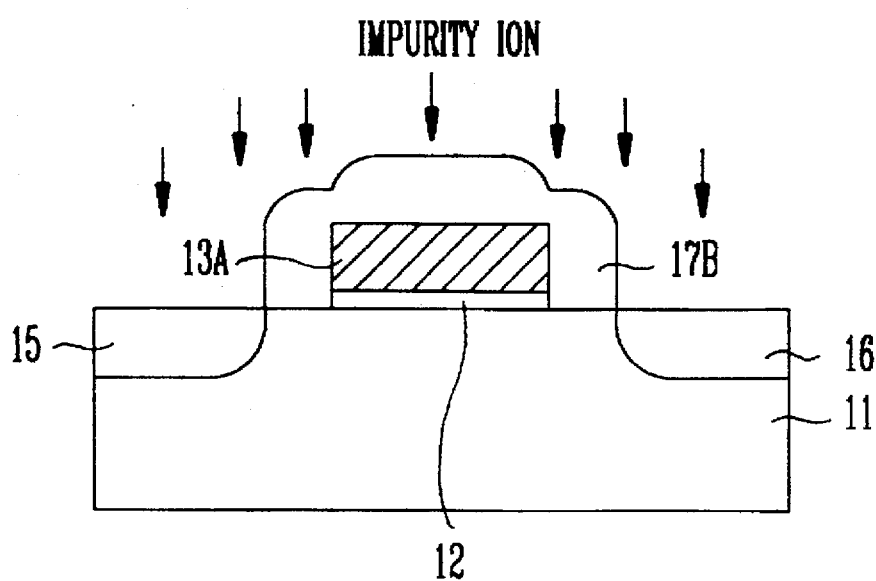

Referring to FIG. 2B, a floating gate 13A is formed by patterning the tunnel oxide layer 12 and the first polysilicon layer 13 by means of an etching process using the first photoresist pattern 17A as a mask and the first photoresist pattern 17A is then removed. A photoresist is coated on the resulting structure after removing the first photoresist pattern 17A and patterned by a photolithography method so that portions of the silicon substrate 11 are exposed, thereby forming a second photoresist pattern 17B which surrounds the floating gate 13A and the patterned tunnel oxide layer 12. A source region 15 and a drain region 16 are formed in the silicon substrate 11 under side portions of the floating gate 13A by implanting an impurity ion using the second photoresist pattern 17B as a mask.

In the process of patterning the photoresist, the reason for patterning the photoresist to surround the floating gate 13A and the patterned tunnel oxide layer 12 is to provide a longer channel length by maximizing interval between the source and drain regions 15 and 16 which are formed by an impurity ion implanting process using the second photoresist pattern 17B as a mask.

Figure 2C:
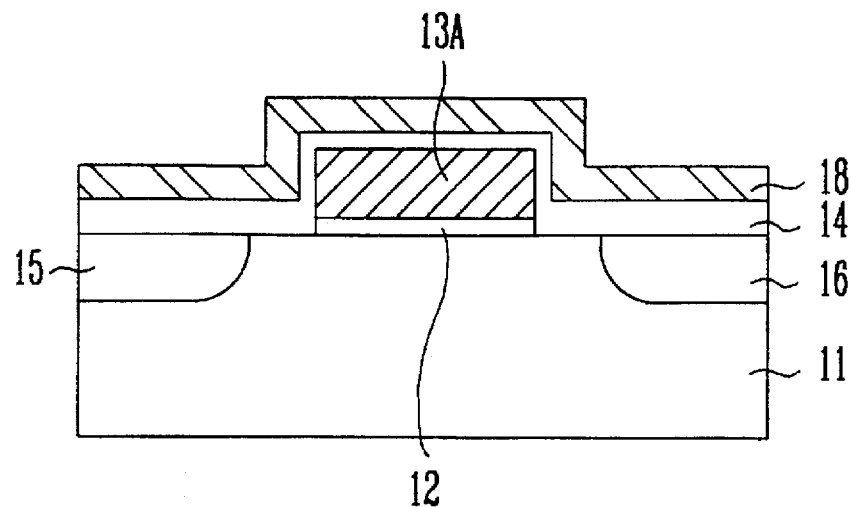

FIG. 2C illustrates the formation of a dielectric layer 14 and a second polysilicon layer 18 on the resulting structure after removing the second photoresist pattern 17B.

Figure 2D:
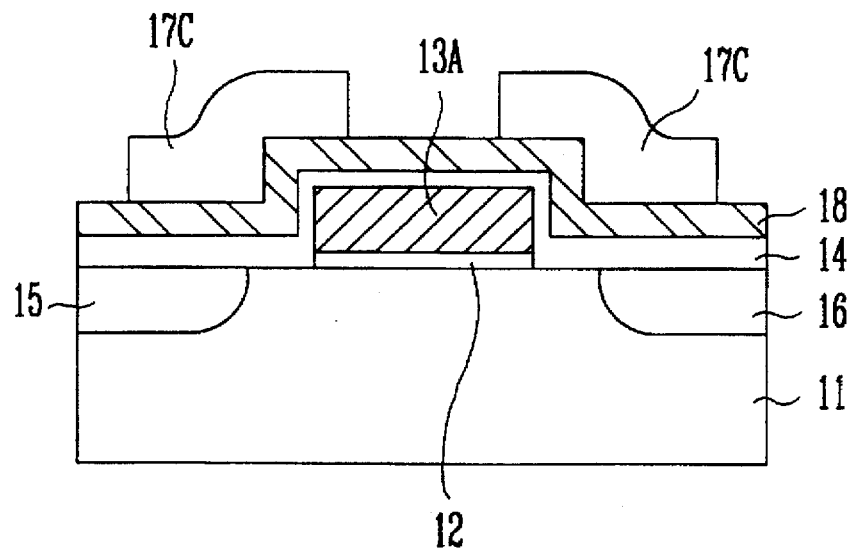

As shown in FIG. 2D, a photoresist is coated on the resulting structure after forming the second polysilicon layer 18 and then patterned by a photolithography method to be exposed a portion of the second polysilicon layer 18, whereby a third photoresist pattern 17C is formed.

Figure 2E:
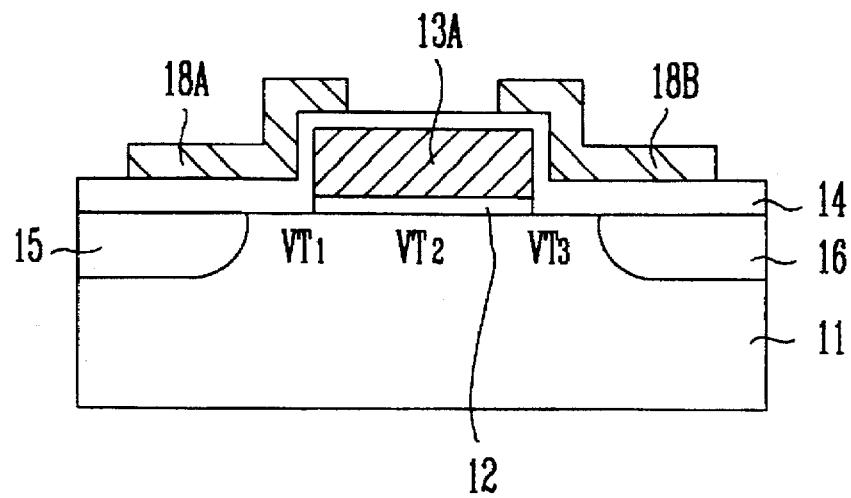

Referring to FIG. 2E, the second polysilicon layer 18 is patterned by an etching process using the third photoresist pattern 17C as a mask, thereby forming a first control gate 18A and a second control gate 18B which are isolated from each other. As shown in FIG. 2E, the first control gate 18A and the second control gate 18B are symmetrical about the floating gate 13B.

Operation of the flash EEPROM cell according to the present invention as shown in FIG. 2E will be explained.

A. Program operation

When a high voltage is applied to the first control gate 18A which is overlapped to the source region 15, a middle voltage between a high voltage and a lower voltage is applied to the second control gate 18B, a third channel is formed between the drain region 16 and the silicon substrate 11 under the tunnel oxide layer 12 by a threshold voltage $VT_3$, whereby charge is injected to the floating gate 13A through the third channel.

B. Erasure operation

When a middle voltage between a high voltage and a lower voltage is applied to the first control gate 18A which is overlapped to the source region 15, a high voltage is applied to the source region 15, a first channel is formed between the source region 15 and the silicon substrate 11 under the tunnel oxide layer 12 by a threshold voltage $VT_1$, whereby charge is discharged toward the source region 15 from the floating gate 13A through the first channel.

C. Read out operation

When a middle voltage between a high voltage and a lower voltage is applied to the first control gate 18A which is overlapped to the source region 15, the second control gate 18B which is overlapped to the drain region 16 and the drain region 16, a second channel is formed in the silicon substrate 11 under the tunnel oxide layer 12 by a threshold voltage $VT_2$ as well as the first and third channels are formed by a threshold voltage $VT_1$ and a threshold voltage $VT_3$.

Accordingly, current may be flowed between the source region 15 and the drain region 16 depend on charge stored on the floating gate 13A. That is, the current flows between the source region 15 and the drain region 16, it is recognized to logical "1", otherwise, logical "0".

As described above, topology of the device can be decreased since the floating gate and the first and control gates are in stack. Also, the threshold voltage of the cell can control with ease by forming two control gates which are symmetrical about a floating gate.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a flash EEPROM cell comprising the steps of:

sequentially forming a tunnel oxide layer and a floating gate on a selected portion of a silicon substrate;

forming source and drain regions in said silicon substrate under side portions of said floating gate;

forming a dielectric layer on said source and drain regions and said floating gate after forming said source and drain regions;

forming first and second control gates on said dielectric layer so that said first and second control gates are isolated from each other and surrounds a portion of said floating gate, respectively.

2. The method of claim 1, wherein said first and second control gates are symmetrical about said floating gate.

3. A method of manufacturing a flash EEPROM cell comprising the steps of:

sequentially forming a tunnel oxide layer and a floating gate on a selected portion of a silicon substrate;

forming a photoresist pattern to be exposed portions of said silicon substrate, wherein said photoresist pattern surrounds and said floating gate and tunnel oxide layer;

forming source and drain regions in said silicon substrate under side portions of said floating gate using said photoresist pattern as a mask;

removing said photoresist pattern;

forming a dielectric layer on said source and drain regions and said floating gate after removing said photoresist pattern; and forming first and second control gates on said dielectric layer so that said first and second control gates are isolated from each other and surrounds a portion of said floating gate, respectively.

4. The method of claim 3, wherein said first and second control gates are symmetrical about said floating gate.

* * * * *